(12) United States Patent
Tierling

(10) Patent No.: US 7,154,470 B2
(45) Date of Patent: Dec. 26, 2006

(54) ENVELOPE MODULATOR FOR HAPTIC FEEDBACK DEVICES

(75) Inventor: Kollin M. Tierling, Milpitas, CA (US)

(73) Assignee: Immersion Corporation, San Jose, CA (US)

( * ) Notice: Subject to any disclaimer, the term of this patent is extended or adjusted under 35 U.S.C. 154(b) by 79 days.

(21) Appl. No.: 10/208,575

(22) Filed: Jul. 29, 2002

(65) Prior Publication Data

US 2003/0057934 A1    Mar. 27, 2003

Related U.S. Application Data

(63) Continuation-in-part of application No. 09/908,184, filed on Jul. 17, 2001.

(60) Provisional application No. 60/309,913, filed on Aug. 2, 2001.

(51) Int. Cl.
    *G09G 5/00* (2006.01)

(52) U.S. Cl. ....................... 345/156; 345/163

(58) Field of Classification Search ........ 345/156–161, 345/163

See application file for complete search history.

(56) References Cited

U.S. PATENT DOCUMENTS

| 2,972,140 | A | 2/1961 | Hirsch |
|---|---|---|---|
| 3,157,853 | A | 11/1964 | Hirsch |
| 3,220,121 | A | 11/1965 | Cutler |
| 3,497,668 | A | 2/1970 | Hirsch |
| 3,517,446 | A | 6/1970 | Corlyon et al. |
| 3,623,064 | A | 11/1971 | Kagan |
| 3,902,687 | A | 9/1975 | Hightower |
| 3,903,614 | A | 9/1975 | Diamond et al. |
| 3,911,416 | A | 10/1975 | Feder |
| 4,127,752 | A | 11/1978 | Lowthorp |
| 4,160,508 | A | 7/1979 | Salisbury, Jr. |
| 4,236,325 | A | 12/1980 | Hall et al. |
| 4,262,549 | A | 4/1981 | Schwellenbach |
| 4,333,070 | A | 6/1982 | Barnes |
| 4,464,117 | A | 8/1984 | Foerst |
| 4,484,191 | A | 11/1984 | Vavra |
| 4,513,235 | A | 4/1985 | Acklam et al. |

(Continued)

FOREIGN PATENT DOCUMENTS

EP    0 349 086 A1    1/1990

(Continued)

OTHER PUBLICATIONS

Baigrie, "Electric Control Loading—A Low Cost, High Performance Alternative," *Proceedings of Interservice/Industry Training Systems Conference*, pp. 247-254, Nov. 6-8, 1990.

(Continued)

*Primary Examiner*—Richard Hjerpe
*Assistant Examiner*—Jean Lesperance
(74) *Attorney, Agent, or Firm*—Thelen Reid & Priest LLP; David B. Ritchie

(57) ABSTRACT

An amplitude modulator circuit includes a reference oscillator and an envelope modulator coupled to the reference oscillator for receiving a reference signal. A microcontroller is coupled to the envelope modulator for providing an envelope signal to the envelope modulator and a low pass filter is coupled to the envelope modulator for receiving a modulated command from the envelope modulator. An inverter is coupled to the low pass filter for receiving a low passed envelope modulated signal from the low pass filter and a transducer or amplifier is coupled to the inverter and the low pass filter for receiving an inverted low passed signal and the low passed envelope modulated signal.

20 Claims, 2 Drawing Sheets

U.S. PATENT DOCUMENTS

| | | | |
|---|---|---|---|
| 4,581,491 A | 4/1986 | Boothroyd | |
| 4,599,070 A | 7/1986 | Hladky et al. | |
| 4,708,656 A | 11/1987 | de Vries et al. | |
| 4,713,007 A | 12/1987 | Alban | |
| 4,771,344 A | 9/1988 | Fallacaro et al. | |
| 4,794,392 A | 12/1988 | Selinko | |
| 4,885,565 A | 12/1989 | Embach | |
| 4,891,764 A | 1/1990 | McIntosh | |
| 4,930,770 A | 6/1990 | Baker | |
| 4,934,694 A | 6/1990 | McIntosh | |
| 5,019,761 A | 5/1991 | Kraft | |
| 5,022,384 A | 6/1991 | Freels | |
| 5,022,407 A | 6/1991 | Horch et al. | |
| 5,035,242 A | 7/1991 | Franklin et al. | |
| 5,038,089 A | 8/1991 | Szakaly | |
| 5,078,152 A | 1/1992 | Bond et al. | |
| 5,103,404 A | 4/1992 | McIntosh | |
| 5,165,897 A | 11/1992 | Johnson | |
| 5,175,459 A | 12/1992 | Danial et al. | |
| 5,186,695 A | 2/1993 | Mangseth et al. | |
| 5,212,473 A | 5/1993 | Louis | |
| 5,240,417 A | 8/1993 | Smithson et al. | |
| 5,271,290 A | 12/1993 | Fischer | |
| 5,275,174 A | 1/1994 | Cook | |
| 5,283,970 A | 2/1994 | Aigner | |
| 5,299,810 A | 4/1994 | Pierce et al. | |
| 5,309,140 A | 5/1994 | Everett, Jr. et al. | |
| 5,334,027 A | 8/1994 | Wherlock | |
| 5,388,992 A * | 2/1995 | Franklin et al. | 434/114 |
| 5,436,622 A | 7/1995 | Gutman et al. | |
| 5,437,607 A | 8/1995 | Taylor | |
| 5,466,213 A | 11/1995 | Hogan et al. | |
| 5,547,382 A | 8/1996 | Yamasaki et al. | |
| 5,575,761 A | 11/1996 | Hajianpour | |
| 5,649,020 A | 7/1997 | McClurg et al. | |
| 5,684,722 A * | 11/1997 | Thorner et al. | 703/3 |
| 5,690,582 A | 11/1997 | Ulrich et al. | |
| 5,734,236 A | 3/1998 | Motegi | |
| 5,766,016 A | 6/1998 | Sinclair et al. | |
| 5,767,839 A | 6/1998 | Rosenberg | |
| 5,785,630 A | 7/1998 | Bobick et al. | |
| 5,952,806 A | 9/1999 | Muramatsu | |
| 6,088,019 A | 7/2000 | Rosenberg | |
| 6,111,577 A | 8/2000 | Zilles et al. | |
| 6,160,489 A | 12/2000 | Perry et al. | |
| 6,211,861 B1 | 4/2001 | Rosenberg et al. | |
| 6,216,059 B1 | 4/2001 | Ierymenko | |
| 6,219,034 B1 | 4/2001 | Elbing et al. | |
| 6,422,941 B1 | 7/2002 | Thorner et al. | |
| 6,429,846 B1 | 8/2002 | Rosenberg et al. | |
| 6,697,043 B1 | 2/2004 | Shahoian | |
| 6,717,573 B1 | 4/2004 | Shahoian et al. | |

FOREIGN PATENT DOCUMENTS

| | | |
|---|---|---|
| JP | H2-185278 | 7/1990 |
| JP | H4-8381 | 1/1992 |
| JP | H5-192449 | 8/1993 |
| JP | H7-24147 | 1/1995 |

OTHER PUBLICATIONS

Iwata, "Pen-based Haptic Virtual Enviroment," 0-7803-1363-1/93 IEEE, pp. 287-292, 1993.

Russo, "The Design and Implementation of a Three Degree of Freedom Force Output Joystick," *MIT Libraries Archives* pp. 1-131, May 1990, archived Aug. 14, 1990.

Brooks et al., "Hand Controllers for Teleoperation—A State-of-the-Art Technology Survey and Evaluation," *JPL Publication* 85-11, NASA-CR-175890; N85-28559, pp. 1-84, Mar. 1, 1985.

Jones et al., "A perceptual analysis of stiffness," ISSN 0014-4819 Springer International (Springer-Verlag); *Experimental Brain Research*, vol. 79, No. 1, pp. 150-156, 1990.

Burdea et al., "Distributed Virtual Force Feedback, Lecture Notes for Workshop on Force Display in Virtual Environments and its Application to Robotic Teleoperation," *1993 IEEE International Conference on Robotics and Automation*, pp. 25-44, May 2, 1993.

Snow et al., "Model-X Force-Reflecting-Hand-Controller," NT Control No. NPO-17851; JPL Case No. 7348, pp. 1-4 with 45 pages of attachments, Jun. 15, 1989.

Ouh-Young, "Force Display in Molecular Docking," Doctoral Dissertation, University of North Carolina at Chapel Hill, UMI Order No. 9034744, p. 1-369, 1990.

Tadros, "Control System Design for a Three Degree of Freedom Virtual Environment Simulator Using Motor/Brake Pair Actuators," *MIT Archive*, pp. 1-88, Feb. 1990, archived Aug. 13, 1990.

Caldwell et al., "Enhanced Tactile Feedback (Tele-Taction) Using a Multi-Functional Sensory System," 1050-4729/93, pp. 955-960, 1993.

Adelstein et al., "Design and Implementation of a Force Reflecting Manipulandum for Manual Control research," DSC-vol. 42, *Advances in Robotics*, pp. 1-12, 1992.

Gotow et al., "Controlled Impedance Test Apparatus for Studying Human Interpretation of Kinesthetic Feedback," WA11-11:00, pp. 332-337.

Stanley et al., "Computer Simulation of Interacting Dynamic Mechanical Systems Using Distributed Memory Parallel Processors," DSC-vol. 42, *Advances in Robotics*, pp. 55-61, ASME 1992.

Russo, "Controlling Dissipative Magnetic Particle Brakes in Force Reflective Devices," DSC-vol. 42, *Advances in Robotics*, pp. 63-70, ASME 1992.

Kontarinis et al., "Display of High-Frequency Tactile Information to Teleoperators," *Telemanipulator Technology and Space Telerobotics*, Won S. Kim, Editor, Proc. SPIE vol. 2057, pp. 40-50, Sep. 7-9, 1993.

Patrick et al., "Design and Testing of A Non-reactive, Fingertip, Tactile Display for Interaction with Remote Environments," *Cooperative Intelligent Robotics in Space*, Rui J. deFigueiredo et al, Editor, Proc. SPIE vol. 1387, pp. 215-222, 1990.

Adelstein, "A Virtual Environment System For The Study of Human Arm Tremor," *Ph.D. Dissertation*, Dept. of Mechanical Engineering, MIT, Jun. 1989, archived Mar. 13, 1990.

Bejczy et al., "Sensors, Controls, and Man-Machine Interface for Advanced Teleoperation," *Science*, vol. 208, No. 4450, pp. 1327-1335, 1980.

Bejczy et al., "Generalization of Bilateral Force-Reflecting Control of Manipulators," *Proceedings Of Fourth CISM-IFToMM*, Sep. 8-12, 1981.

McAffee et al., "Teleoperator Subsystem/Telerobot Demonstrator: Force Reflecting Hand Controller Equipment Manual," JPL 1988, JPL D-5172.

Minsky, "Computational Haptics: The Sandpaper System for Synthesizing Texture for a Force-Feedback Display," *Ph.D. Dissertation*, MIT, Jun. 1995, archived Jul. 6, 1995.

Jacobsen et al., "High Performance, Dextrous Telerobotic Manipulator With Force Reflection," *Intervention/ROV '91 Conference & Exposition*, Hollywood, Florida, May 21-23, 1991.

Shimoga, "Finger Force and Touch Feedback Issues in Dexterous Telemanipulation," *Proceedings of Fourth Annual Conference on Intelligent Robotic Systems for Space Exploration*, Rensselaer Polytechnic Institute, Sep. 30-Oct. 1, 1992.

IBM Technical Disclosure Bulletin, "Mouse Ball-Actuating Device With Force and Tactile Feedback," vol. 32, No. 9B, Feb. 1990.

Terry et al., "Tactile Feedback In A Computer Mouse," *Proceedings of Fourteenth Annual Northeast Bioengineering Conference, University of New Hampshire*, Mar. 10-11, 1988.

Howe, "A Force-Reflecting Teleoperated Hand System for the Study of Tactile Sensing in Precision Manipulation," *Proceedings of the 1992 IEEE International Conference on Robotics and Automation*, Nice, France, May 1992.

Eberhardt et al., "OMAR—A Haptic display for speech perception by deaf and deaf-blind individuals," *IEEE Virtual Reality Annual International Symposium*, Seattle, WA, Sep. 18-22, 1993.

Rabinowitz et al., "Multidimensional tactile displays: Identification of vibratory intensity, frequency, and contractor area," *Journal of The Acoustical Society of America*, vol. 82, No. 4, Oct. 1987.

Bejczy et al., "Kinesthetic Coupling Between Operator and Remote Manipulator," *International Computer Technology Conference, The American Society of Mechanical Engineers*, San Francisco, CA, Aug. 12-15, 1980.

Bejczy et al., "A Laboratory Breadboard System For Dual-Arm Teleoperation," *SOAR '89 Workshop, JSC*, Houston, TX, Jul. 25-27, 1989.

Ouhyoung et al., "A Low-Cost Force Feedback Joystick and Its Use in PC Video Games," *IEEE Transactions on Consumer Electronics*, vol. 41, No. 3, Aug. 1995.

Marcus, "Touch Feedback in Surgery," *Proceedings of Virtual Reality and Medicine The Cutting Edge*, Sep. 8-11, 1994.

Bejczy et al., "Universal Computer Control System (UCCS) For Space Telerobots," CH2413-3/87/0000/0318501.001987 IEEE, 1987.

Patrick, "Design, Construction, and Testing of a Fingertip Tactile Display for Interaction with Virtual and Remote Environments," *Master of Science Thesis*, MIT, Aug. 1990, archived Nov. 8, 1990.

Calder, "Design of A Force-Feedback Touch-Introducing Actuator For Teleoperator Robot Control," *Bachelor of Science Thesis*, MIT, May 1983, archived Jun. 23, 1983.

Wiker, "Teletouch Display Development: Phase 1 Report," *Technical Report 1230*, Naval Ocean Systems Center, San Diego, Jul. 1988.

Bliss, "Optical-to-Tactile Image Conversion for the Blind," *IEEE Transactions on Man-Machine Systems*, vol. MMS-11, No. 1, Mar. 1970.

Johnson, "Shape-Memory Alloy Tactile Feedback Actuator," *Armstrong Aerospace Medical Research Laboratory*, AAMRL-TR-90-039, Aug. 1990.

Kontarinis et al., "Tactile Display of Vibratory Information in Teleoperation and Virtual Envrionments," PRESENCE, 4(4): 387-402, Harvard Univ., 1995.

Aukstaklnis et al., "Silicon Mirage: The Art and Science of Virtual Reality," ISBN 0-938151-82-7. pp. 129-180, 1992.

Eberhardt et al., "Inducing Dynamic Haptic Perception by The Hand: System Description and Some Results," DSC-vol. 55-1, *Dynamic Systems and Control*: vol. 1, ASME 1994.

Gobel et al., "Tactile Feedback Applied to Computer Mice," *International Journal of Human-Computer Interaction*, vol. 7, No. 1, pp. 1-24, 1995.

Pimentel et al., "Virtual Reality: through the new looking glass," 2$^{nd}$ Edition; McGraw-Hill, ISBN 0-07-050167-X, pp. 41-202, 1994.

"Cyberman Technical Specification," *Logitech Cyberman SWIFT Supplement to Logitech Mouse Technical Reference and Programming Guide*, Apr. 5, 1994.

Ouhyoung et al., "The Development of A Low-Cost Force Feedback Joystick and Its Use in the Virtual Reality Environment," *Proceedings of the Third Pacific Conference on Computer Graphics and Applications, Pacific Graphics '95*, Seoul, Korea, Aug. 21-24, 1995.

Kaczmarek et al., "Tactile Displays," *Virtual Enviroment Technologies*, Chap. 9, pp. 349-414.

Lake, "Cyberman from Logitech," at http://www.ibiblo.org/GameBytes/issue21/greviews/cyberman.html, 1994.

"Component Maintenance Manual With Illustrated Parts List, Coaxial Control Shaker Part No. C-25502," Safe Flight Instrument Corporation, Revised Jan. 28, 2002 (3 pages).

"Technical Manual Overhaul Instructions With Parts Breakdown, Coaxial Control Shaker Part No. C-25502," Safe Flight Instrument Corporation, Revised Jul. 15, 1980 (23 pages).

Scannell, "Taking a Joystick Ride," *Computer Currents*, Boston Edition, vol. 9, No. 11, Nov. 1994.

Yamakita et al., "Tele-Virtual Reality of Dynamic Mechanical Model," *Proceedings of the 1992 IEEE/RSJ International Conference on Intelligent Robots and Systems*, Raleigh, NC, Jul. 7-10, 1992.

Noll, "Man-Machine Tactile," *SID Journal*, Jul./Aug. 1972 Issue.

Rosenberg, "Virtual Fixtures: Perceptual Overlays Enhance Operator Performance In Telepresence Tasks," *Ph.D. Dissertation*, Stanford University, Jun. 1994.

Copending U.S. Appl. No. 09/917,263, filed on Jul. 26, 2001.

Copending U.S. Appl. No. 09/908,184, filed on Jul. 17, 2001.

Copending U.S. Appl. No. 09/967,494, filed on Sep. 27, 2001.

Copending U.S. Appl. No. 09/965,097, filed on Sep. 28, 2001.

* cited by examiner

ENVELOPE MODULATOR FOR HAPTIC FEEDBACK DEVICES

CROSS-REFERENCES TO RELATED APPLICATIONS

This application claims benefit of U.S. Provisional Application No. 60/309,913 filed Aug. 2, 2001, the disclosure of which is incorporated by reference in its entirety. This application is a continuation-in-part of U.S. application Ser. No. 09/908,184 filed Jul. 17, 2001.

BACKGROUND OF THE INVENTION

The present invention relates generally to the control of haptic feedback interface devices that interface a user with a computer device.

Humans interface with electronic and mechanical devices in a variety of applications, and the need for a more natural, easy-to-use, and informative interface is a constant concern. In the context of the present invention, humans interface with computer devices for a variety of applications. One such application is interacting with computer-generated environments such as games, simulations, and application programs. Computer input devices such as mice and trackballs are often used to control a cursor within a graphical environment and provide input in these applications. In portable computer or electronic devices, such as laptop computers or personal digital assistants (PDAs), mice typically have too large a workspace to be practical. A popular device for portable computers are "touchpads," or touchscreens, which are small rectangular, planar pads that sense the location of a pointing object by any of a variety of sensing technologies.

In some interface devices, haptic feedback is also provided to the user. These types of interface devices can provide physical sensations which are felt by the user manipulating the user object of the interface device. One or more motors or other type of actuators are coupled to the device housing or manipulandum and are connected to the controlling computer system. The computer system controls forces output by the actuators in conjunction and coordination with displayed events. The computer system can thus convey physical force sensations to the user in conjunction with other supplied feedback as the user is grasping or contacting the interface device or manipulatable object.

In many haptic feedback devices, the haptic feedback takes the form of vibrations, jolts, or pulses output on the housing or manipulandum and are thus experienced by the user, referred to as "tactile" sensations herein. For example, many gamepad devices include a spinning eccentric mass that creates inertial vibrations on the housing or object. Other devices, such as the I-Feel Mouse from Logitech Corp., provide inertial vibrations using a linearly-moving mass. Still other devices may vibrate a housing or object by impacting or directly moving the housing or object with the actuator.

One problem with current haptic feedback devices is that tactile sensations output to the user tend to be more effective in particular frequency ranges and are less effective in other frequency ranges, thus causing haptic sensations to feel uneven and inconsistent to the user over broad frequency ranges.

SUMMARY OF THE INVENTION

In accordance with one aspect of the present invention, an amplitude modulator circuit comprises a reference oscillator and an envelope modulator coupled to the reference oscillator for receiving a reference signal. A microcontroller is coupled to the envelope modulator for providing an envelope signal to the envelope modulator and a low pass filter is coupled to the envelope modulator for receiving a modulated command from the envelope modulator. An inverter is coupled to the low pass filter for receiving a low passed envelope modulated signal from the low pass filter and a transducer or amplifier is coupled to the inverter and the low pass filter for receiving an inverted low passed signal and the low passed envelope modulated signal.

In accordance with another aspect of the present invention, the reference oscillator comprises a sine wave generator.

In accordance with a further aspect of the present invention, the envelope modulator comprises a ramp generator circuit.

In accordance with yet another aspect of the present invention, the low pass filter is a second order low pass filter.

In accordance with a further aspect of the present invention, a method of amplitude modulation of a resonant frequency sinusoid by a pulse width modulated envelope function comprises providing an envelope wave shape to an envelope modulator, providing a sinusoidal reference signal to the envelope modulator, providing a modulated command from the envelope modulator to a low pass filter, providing a low passed modulated command signal from the low pass filter to an inverter and a transducer or amplified, and providing an inverted low passed modulated command signal from the inverter to the transducer or amplifier passed modulated command signal.

Other features and advantages of the present invention will be understood upon reading and understanding the description of the preferred exemplary embodiments, found hereinbelow, in conjunction with reference to the drawings, in which like numerals represent like elements.

DESCRIPTION OF SPECIFIC PREFERRED EXEMPLARY EMBODIMENTS

The present invention is an alternative embodiment of an envelope modulation approach referred to in patent application Ser. No. 09/908,184, filed Jul. 17, 2001, which is incorporated herein by reference in its entirety for all purposes. That invention as well as the one described herein, provides methods used to modulate a high frequency signal, suitable for driving a vibrotactile transducer, with a lower frequency signal that contains tactile information. The composite or modulated signal is used to drive an actuator that conveys the lower frequency tactile information to the human user via electrical amplification that drives a transducer, thereby mechanically conveying the tactile information to the user. The high frequency signal oscillates at a frequency that is close to the resonant frequency of the mechanical actuator driven by the transducer, and hence the haptic sensations benefit from mechanical amplification caused by the resonant signal. In patent application Ser. No. 09/908,184, one methodology described is to multiply a resonant frequency sinusoid by the modulating envelope. The amplitude modulated sinusoid then commands an amplifier as a pulse width modulated signal.

A conventional approach requires that the pulse width modulated (PWM) frequency be updated at a high rate in order to accurately conform to a sinusoidal resonant frequency waveform. Deviations from a pure sinusoid generate audible noise in the actuator that detracts from the actuator as a tactile device. A high PWM update rate would be necessary to accurately command a sinusoid that may be in the 100 to 200 Hz range. Such a high update rate would consume significant processor duty cycle and potentially require a more costly processor than with the invention described herein.

The present invention describes amplitude modulation of a resonant frequency sinusoid by a pulse width modulated envelope function to provide strong haptic sensations over a broad frequency range.

A preferred embodiment of the present inventive approach is to use an electronic circuit to perform the envelope modulation function so that the processor only needs to command the envelope wave shape, which is a much lower frequency signal that requires a lower processor update rate. Use of a single electronic circuit reduces costs of the device, since separate components such as op amps or other amplifiers are not required.

Figure 1:
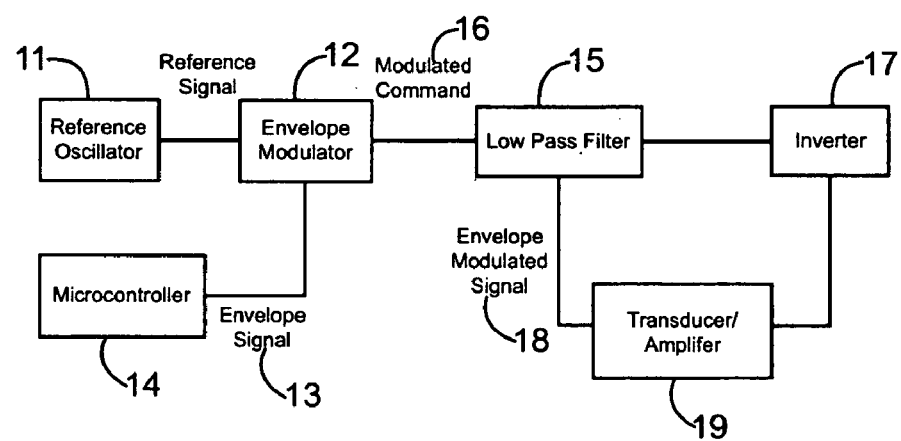
FIG. 1 is a schematic view illustrating a design topology of an embodiment of a circuit in accordance with the present invention.

FIG. 1 illustrates a design topology of one embodiment of the present invention. The inventive circuit topology 10 includes a signal generator ("reference oscillator") 11 that produces a sinusoidal reference signal with a frequency that is the same as (or close to) the mechanical resonant frequency of the tactile actuator. If the mechanical system has more than one resonant frequency, one of the resonant frequencies is chosen at which the oscillator will provide the signal. An actuator, such as a piezoelectric actuator or other actuator driving an oscillating mass or manipulandum, typically has a resonant frequency at which output forces (vibrations) are strongest due to the mechanical properties of the system. It is this resonant frequency at which the actuator is preferably driven.

The circuit topology of FIG. 1 also includes an envelope modulator 12 that amplitude modulates the reference signal output by the reference oscillator with an envelope signal 13 from a microcontroller (processor) 14, such as a microprocessor, state machines, etc. The envelope signal can include haptic effects or features that are desired to be output to the user, such as a jolt, a vibration of a desired frequency, etc. A low pass filter 15 receives modulated command 16 output by the envelope modulator. The low pass filter removes the high frequency content of the command envelope signal from the processor. An inverter 17 receives the low passed signal from the filter to provide a differential output signal. The low passed envelope modulated signal 18 from the low pass filter is also sent to a transducer or amplifier 19, such as a piezo transducer or motor amplifier. The inverted low passed signal from the inverter is also sent to the transducer or amplifier so that a differential drive signal is provided to the transducer or amplifier. Other embodiments can produce a single ended signal that either drives the transducer directly or indirectly through an amplifier.

Figure 2:
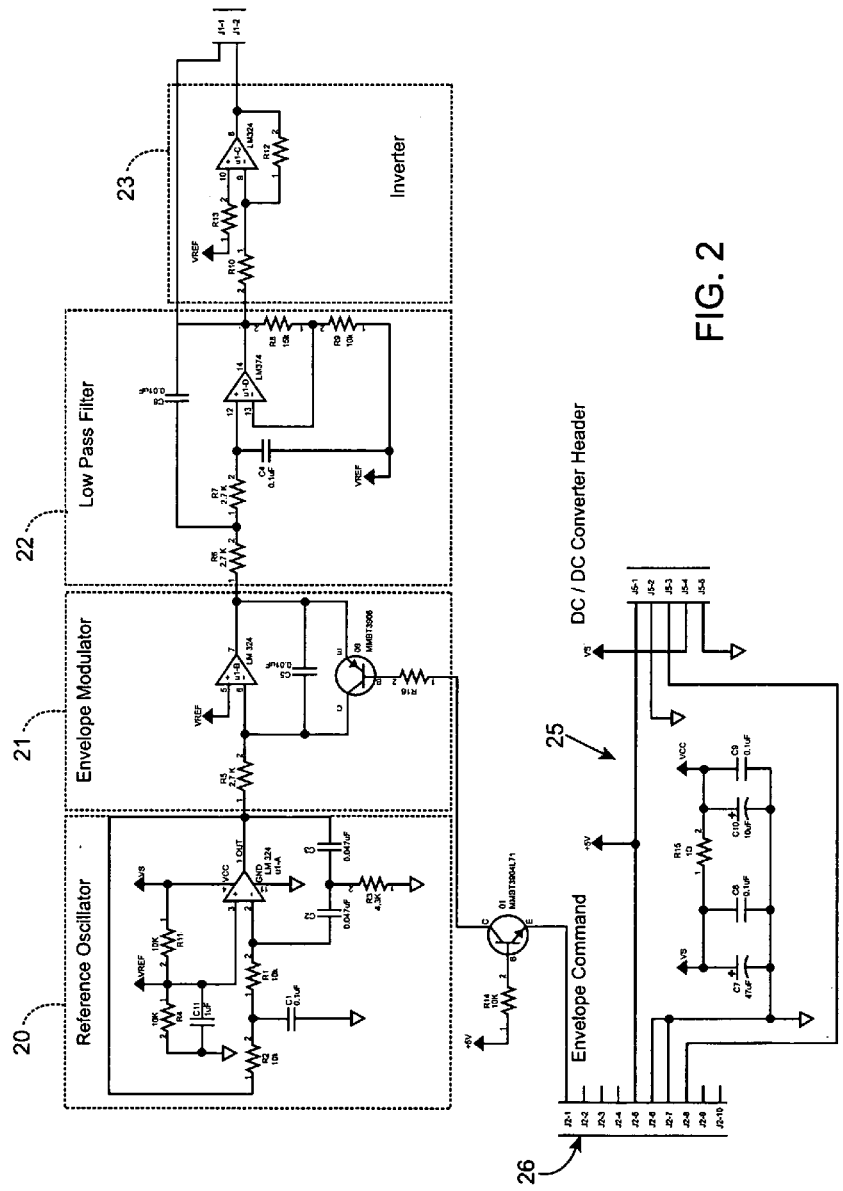
FIG. 2 is a schematic of an example of a circuit in accordance with the present invention.

FIG. 2 illustrates an example of a more detailed embodiment of the present invention. This embodiment consists of four circuits. The first circuit is a sine wave generator (reference oscillator) 20. The sine wave generator produces a reference sinusoidal function with a frequency that is the same as (or close to) a mechanical resonant frequency of the actuator. This reference signal is one of the two signals used by the second circuit. The signal generator is preferably a free-running oscillator that is formed by a double integrating feedback loop.

The second circuit is an envelope modulator 21 that generates a series of pulses at the processor's PWM frequency (for example, nominally 24 kHz) with an amplitude that is proportional to the instantaneous voltage of the reference sinusoid. This circuit is preferably a ramp generator that is reset when the PWM signal is low. When the PWM signal is high, the ramp generator produces a sawtooth output signal with an output voltage that increases linearly in time at a rate that is proportional to the instantaneous voltage of the reference sinusoid. In this way, the circuit produces a series of sawtooth pulses with a width proportional to the PWM duty cycle and height proportional to the instantaneous voltage of the reference sinusoid. The average voltage of the sawtooth signal is therefore the same as a signal that would be produced by directly multiplying the reference sinusoid by the PWM command signal. The sawtooth signal output waveform from this circuit then feeds into the third circuit. An envelope command indicating envelope wave shape is provided by microprocessor 25 at output 26.

The third circuit is a second order low pass filter 22 with a corner frequency that lies between the resonant frequency of the actuator (or mechanical system) and the pulse width modulation frequency of the command signal. The fourth circuit is an inverter 23 that inverts the output of the third circuit. The signals output from the third and fourth circuits constitute a differential drive signal that is modulated at the reference sinusoid frequency and has an amplitude that is proportional to the duty cycle of the commanded PWM signal. This differential drive signal can then drive a piezo transducer directly or be amplified to drive an electric motor (such as a DC motor) or other actuator.

The invention frees the processor from the task of performing the envelope modulation function at a sufficiently high update rate to produce a clean modulated sinusoidal output.

A prototype circuit demonstrated that the circuit was able to drive either one or two piezo transducers, and that a constant frequency sinusoidal waveform was being modulated by the PWM envelope command from a TouchSense processor. The prototype circuit further demonstrated that the generated waveform was exciting an inertially grounded mass/transducer/spring system at its mechanical resonant frequency. The frequency of the sinusoidal driving function was tuned to the resonant frequency of the mechanical system. The tactile sensation felt when touching the mass in the mechanical system conveyed the impression that it was excited at the much lower envelope function frequency rather than the mechanical system's resonant frequency.

The present invention is suitable to drive actuators to provide haptic sensations in a variety of haptic feedback computer interface devices, including mice, joysticks, trackballs, gamepads, remote controls, PDA's, touchpads for laptop computers, touchscreens for a variety of devices, gloves, steering wheels, etc. Some examples of suitable devices and haptic sensations are described in copending application Ser. No. 09/917,263, filed Jul. 26, 2001, entitled, "Haptic Interface for Laptop Computers and Other Portable Devices," including piezoelectric transducer embodiments, and which is incorporated herein by reference in its entirety for all purposes. Other tactile devices and sensations used for inertial tactile feedback, and suitable for use with the present invention, are described in U.S. Pat. Nos. 6,211,861 and 6,088,019 and application Ser. Nos. 09/585,741, and 09/487,737, all incorporated herein by reference in their entirety for all purposes. Other interface device embodiments suitable for use with the present invention are described in Ser. Nos. 09/759,780, 60/236,417, and 60/236,558, incorporated by reference herein in their entirety for all purposes.

While this invention has been described in terms of preferred exemplary embodiments, there are alterations, modifications, and permutations thereof which fall within the scope of this invention. It should also be noted that the embodiments described above can be combined in various ways in a particular implementation. Furthermore, certain terminology has been used for the purposes of descriptive clarity, and not to limit the present invention.

What is claimed is:

1. An apparatus, comprising:
   a reference oscillator configured to provide a reference signal having a frequency substantially similar to a resonant frequency of an actuator;
   a controller configured to provide an envelope signal, wherein the envelope signal includes tactile information; and
   an envelope modulator coupled to the reference oscillator and the controller, the envelope modulator configured to modulate the reference signal with the envelope signal to produce a modulated command signal, the envelope modulator being configured to provide an output signal, the output signal configured to drive the actuator to output a haptic effect based on the modulated command signal.

2. The apparatus of claim 1, further comprising:
   a filter coupled to the envelope modulator, the filter configured to produce a filtered modulated command signal based on the modulated command signal, the output signal being based on the filtered modulated command signal.

3. The apparatus of claim 1, further comprising:
   a low-pass filter coupled to the envelope modulator, the low-pass filter configured to produce a low-pass filtered modulated command signal based on the modulated command signal, the output signal being based on the low-pass filtered modulated command signal.

4. The apparatus of claim 1, further comprising:
   a second-order low-pass filter coupled to the envelope modulator, the second-order low-pass filter configured to produce a second-order low-pass filtered modulated command signal based on the modulated command signal, the output signal being based on the second-order low-pass filtered modulated command signal.

5. The apparatus of claim 1, further comprising:
   a filter coupled to the envelope modulator, the filter configured to produce a filtered modulated command signal based on the modulated command signal; and
   an inverter coupled to the filter, the inverter configured to produce an inverted filtered modulated command signal based on the filtered modulated command signal, the output signal being based on the inverted filtered modulated command signal.

6. The apparatus of claim 1, further comprising:
   a filter coupled to the envelope modulator, the filter configured to produce a filtered modulated command signal based on the modulated command signal; and
   an inverter coupled to the filter, the inverter configured to produce an inverted filtered modulated command signal and a differential output signal based on the filtered modulated command signal, the output signal being based on the differential output signal.

7. The apparatus of claim 1, further comprising:
   a filter coupled to the envelope modulator, the filter configured to produce a filtered modulated command signal based on the modulated command signal; and
   an amplifier coupled to the filter, the amplifier configured to produce an amplified filtered modulated command signal based on the filtered modulated command signal, the output signal being based on the amplified filtered modulated command signal.

8. The apparatus of claim 1, further comprising:
   a filter coupled to the envelope modulator, the filter configured to produce a filtered modulated command signal based on the modulated command signal,
   the actuator being a transducer, the transducer being coupled to the filter and configured to provide a physical response based on the filtered modulated command signal.

9. The apparatus of claim 1, wherein the reference oscillator includes a sine wave generator.

10. The apparatus of claim 1, wherein the envelope modulator includes a ramp generator.

11. A method, comprising:
    generating a reference signal having a frequency substantially similar to a resonant frequency of an actuator;
    generating an envelope signal from a microcontroller, wherein generating an envelope signal further includes providing tactile information;
    modulating the reference signal with the envelope signal to produce a modulated command signal; and
    providing an output signal based on the modulated command signal; and
    driving the actuator with the output signal to output a haptic effect.

12. The method of claim 11, further comprising:
    filtering the modulated command signal to produce a filtered modulated command signal, the output signal being based on the filtered modulated command signal.

13. The method of claim 11, further comprising:
    low-pass filtering the modulated command signal to produce a low-pass filtered modulated command signal, the output signal being based on the low-pass filtered modulated command signal.

14. The method of claim 11, further comprising:
    inverting the modulated command signal to produce an inverted modulated command signal, the output signal being based on the inverted modulated command signal.

15. The method of claim 11, further comprising:
    filtering the modulated command signal to produce a filtered modulated command signal; and
    inverting the filtered command signal to produce an inverted filtered modulated command signal, the output signal being based on the inverted filtered modulated command signal.

16. The method of claim 11, further comprising:
    filtering the modulated command signal to produce a filtered modulated command signal; and
    inverting the filtered modulated command signal to produce a differential output signal, the output signal being based on the differential output signal.

17. The method of claim 11, further comprising:
    filtering the modulated command signal to produce a filtered modulated command signal; and
    amplifying the filtered modulated command signal to produce an amplified filtered modulated command signal, the output signal being based on the amplified filtered modulated command signal.

18. An apparatus, comprising:
a reference oscillator capable of generating a reference signal having a frequency substantially similar to a resonant frequency of an haptic actuator;
a microcontroller configured to generate an envelope signal, which includes tactile information;
an envelope modulator coupled to the reference oscillator and the microcontroller, wherein the envelope modulator is configured to generate a modulated command signal in response to the reference signal and the envelope signal;
a low-pass filter coupled to the envelope modulator; and
an inverter coupled to the low-pass filter and configured to drive the haptic actuator in response to the modulated command signal.

19. The apparatus of claim 18, further comprising:
an amplifier coupled to the inverter and the haptic actuator.

20. The apparatus of claim 18, wherein the haptic actuator is a transducer.

\* \* \* \* \*